United States Patent
Canham

(10) Patent No.: US 8,399,312 B2
(45) Date of Patent: Mar. 19, 2013

(54) METHODS OF FORMING RADIATION-HARDENED SEMICONDUCTOR STRUCTURES

(75) Inventor: John S. Canham, Ellicott City, MD (US)

(73) Assignee: Alliant Techsystems Inc., Arlington, VA (US)

( * ) Notice: Subject to any disclaimer, the term of this patent is extended or adjusted under 35 U.S.C. 154(b) by 263 days.

(21) Appl. No.: 12/844,684

(22) Filed: Jul. 27, 2010

(65) Prior Publication Data

US 2012/0025311 A1    Feb. 2, 2012

(51) Int. Cl.
*H01L 21/00* (2006.01)

(52) U.S. Cl. .......... 438/149; 438/479; 438/571

(58) Field of Classification Search .......... 438/149, 438/479, 517
See application file for complete search history.

(56) References Cited

U.S. PATENT DOCUMENTS

| | | | |
|---|---|---|---|
| 3,690,953 A | 9/1972 | Wise | |
| 5,236,876 A | 8/1993 | Van Hal et al. | |
| 5,248,890 A * | 9/1993 | Luth et al. | 257/102 |
| 5,795,813 A | 8/1998 | Hughes et al. | |
| 5,807,771 A | 9/1998 | Vu et al. | |
| 6,093,941 A | 7/2000 | Russell et al. | |
| 6,368,938 B1 | 4/2002 | Usenko | |
| 2008/0093670 A1* | 4/2008 | Atanakovic et al. | 257/347 |
| 2008/0149980 A1* | 6/2008 | Govindarajan | 257/306 |
| 2009/0026580 A1* | 1/2009 | Malachowski | 257/607 |

OTHER PUBLICATIONS

Haynes, Gilbert A., Effect of Radiation on Cerium-Doped Solar-Cell Cover Glass, NASA Technical Note, NASA TN D-6024, Dec. 1970, 16 pages.

* cited by examiner

*Primary Examiner* — Long Tran
(74) *Attorney, Agent, or Firm* — TraskBritt

(57) ABSTRACT

A radiation-hardened semiconductor structure including an insulator material doped with at least one of a transition metal, a lanthanide, and an actinide, and a semiconductor material located over the insulator material. A semiconductor device including the radiation-hardened semiconductor structure is also disclosed, as are methods of forming the radiation-hardened semiconductor structure and the semiconductor device.

5 Claims, 2 Drawing Sheets

METHODS OF FORMING RADIATION-HARDENED SEMICONDUCTOR STRUCTURES

TECHNICAL FIELD

The present invention, in various embodiments, relates generally to radiation-hardened semiconductor structures, devices including the radiation-hardened semiconductor structures and methods of forming such radiation-hardened semiconductor structures and devices. More specifically, embodiments of the present invention relate to an insulator material doped with at least one of a transition metal, a lanthanide, and an actinide and a semiconductor material located over the insulator material.

BACKGROUND

Some operating environments for semiconductor devices (for example, complementary metal-oxide semiconductor (CMOS) devices) require that the semiconductor devices be resistant to radiation. For example, space and military operating environments may expose semiconductor devices to radiation. Exposure to radiation can cause conventional semiconductor devices, which are not radiation-hardened to malfunction or even destruct. For example, radiation passing through semiconductor devices deposits energy or causes charged locations within the components, and changes how a device may respond. Devices may be turned on or off, capacitors may be inadvertently charged, memory cells may change state (0 to 1, 1 to 0) corrupting data, and processors may latch up, causing circuit burnout. However, known radiation-tolerant and radiation-hardened semiconductor devices are typically more costly to produce, less energy efficient, and have higher operational costs than non-radiation-tolerant parts.

Semiconductor devices including silicon-on-insulator (SOI) substrates generally exhibit a higher radiation tolerance and lower power consumption than semiconductor devices formed on a monolithic silicon substrate. The smaller volume of silicon on the SOI substrate, and reduced electronic part cross-section, improve resistance to radiation-induced single-event upset. However, the SOI substrate may still be prone to radiation-induced failure due to positive charge buildup within the insulator material. The positive charge buildup results in increased device leakage and threshold voltage shifts. In current SOI devices, the probability of radiation damage due to build-up of radiation damage in the insulator substrate is now a significant portion of the overall probability of radiation damage.

Accordingly, additional improvements in radiation-hardness are desirable, especially for long-term usage of semiconductor devices in harsh environments such as outer space, nuclear reactors, and particle accelerators.

BRIEF SUMMARY

The present invention relates to a radiation-hardened semiconductor structure. An embodiment of a radiation-hardened semiconductor structure includes an insulator material doped with at least one of a transition metal, a lanthanide, and an actinide and a semiconductor material located over the insulator material. In some embodiments, the at least one of a transition metal, a lanthanide, and an actinide may include at least one of cerium, neodymium, and praseodymium.

Further embodiments of the present invention include a semiconductor device including an insulator material doped with at least one of a transition metal, a lanthanide, and an actinide, a semiconductor material located over the insulator material, and a memory cell on the semiconductor material. In some embodiments, a barrier material may be disposed between the insulator material and the semiconductor material.

In additional embodiments of the present invention, a method of forming a radiation-hardened semiconductor structure is disclosed. The method includes forming an insulator material doped with at least one of a transition metal, a lanthanide, and an actinide and forming a semiconductor material over the insulator material. In some embodiments, the at least one of a transition metal, a lanthanide, and an actinide is diffused or implanted into a wafer of insulator material. In additional embodiments, molten raw insulator material and the at least one of a transition metal, a lanthanide, and an actinide are mixed together. The heated raw insulator material and the at least one of a transition metal, a lanthanide, and an actinide are then cooled and solidified to form the insulator material.

In additional embodiments of the present invention, a method of forming a semiconductor device is disclosed. The method includes doping an insulator material with at least one of a transition metal, a lanthanide, and an actinide, forming a semiconductor material over the insulator material, and forming a memory cell over the semiconductor material.

These and other aspects of the present invention will be discussed in greater detail hereinafter.

BRIEF DESCRIPTION OF THE DRAWINGS

While the specification concludes with claims particularly pointing out and distinctly claiming that which is regarded as the present invention, advantages of this invention may be more readily ascertained from the following detailed description when read in conjunction with the accompanying drawings in which:

DETAILED DESCRIPTION

Figure 1:
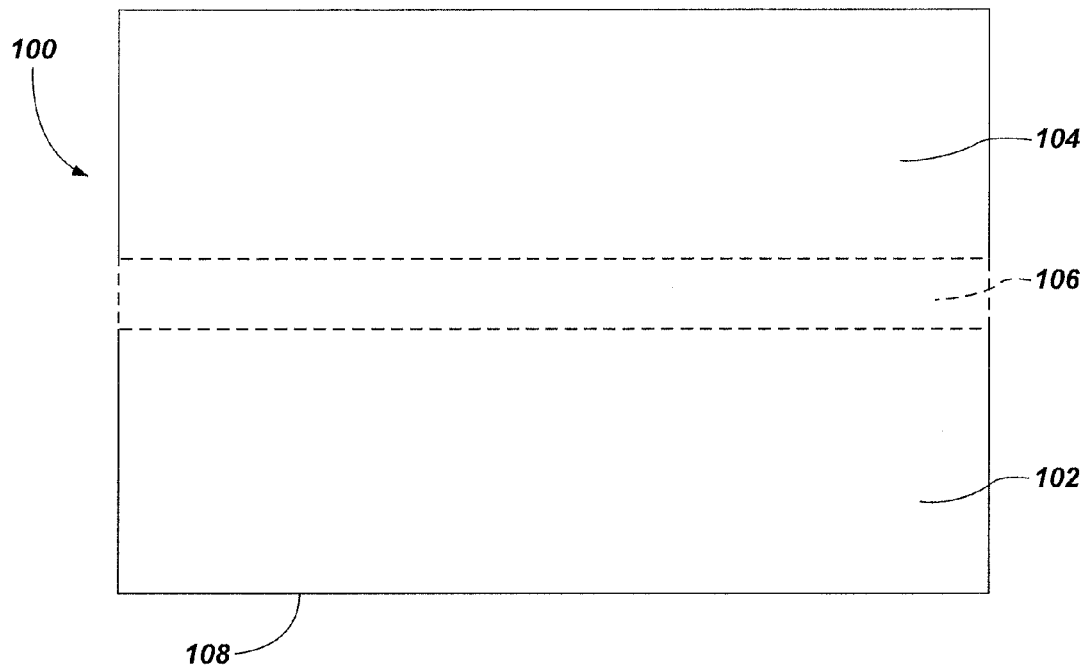
FIG. 1 is a cross-sectional view of a portion of a radiation-hardened semiconductor structure including an insulator material doped with at least one of a transition metal, a lanthanide, and an actinide formed in accordance with an embodiment of the invention.

A radiation-hardened semiconductor structure, a method of forming such a radiation-hardened semiconductor structure, a semiconductor device including the radiation-hardened semiconductor structure, and a method of forming the semiconductor device are disclosed. As used herein, the phrase "radiation-hardened" means and includes a semiconductor structure exhibiting a greater resistance to radiation than a monolithic silicon material or a conventional silicon-on-insulator (SOI) substrate, and such structures may also be characterized as "radiation-tolerant." The radiation-hardened semiconductor structure includes a silicon-on-insulator (SOI) substrate including an insulator material at least partially doped with at least one of a transition metal, a lanthanide, and an actinide. As used herein, the term "insulator material" means and includes electrical insulators, which may also be characterized as dielectrics. By doping the insulator material of the SOI substrate with at least one of a transition metal, a lanthanide, and an actinide, the SOI substrate may exhibit a higher resistance to radiation damage than an undoped silicon substrate or an undoped SOI substrate. As used herein, the term "at least one of a transition metal, a lanthanide and an actinide," means and includes a material within one or more of those material categories, as well as one or more materials within one of those material categories, and one or more materials from more than one of those material categories, in combination.

The following description provides specific details, such as material types, material thicknesses, and processing conditions in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques employed in the industry. In addition, the description provided herein does not form a complete process for manufacturing a semiconductor device or any part thereof. Only those process acts and structures necessary to understand the embodiments of the present invention are described in detail below. Additional acts to form a complete semiconductor device including a radiation-hardened semiconductor structure may be performed by conventional techniques.

Various materials described herein may be deposited or otherwise formed by any suitable technique for a given material including, but not limited to, spin-coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular radiation-hardened semiconductor structure or semiconductor device, but are merely idealized representations that are employed to describe embodiments of the present invention. The drawings presented herein are not necessarily drawn to scale. Additionally, elements common between drawings may retain the same numerical designation.

The radiation-hardened semiconductor structure may comprise a doped SOI substrate. In one embodiment, the radiation-hardened semiconductor structure may include a semiconductor material located over an insulator material doped with at least one of a transition metal, a lanthanide, and an actinide. The at least one of a transition metal, a lanthanide, and an actinide may be in an ionized form within the insulator material. In some embodiments, the at least one of a transition metal, a lanthanide, and an actinide may comprise at least one of cerium, neodymium, and praseodymium.

FIG. 1 is an illustration of a radiation-hardened semiconductor structure 100. The radiation-hardened semiconductor structure 100 may include an insulator material 102 doped with at least one of a transition metal, a lanthanide, and an actinide upon which a semiconductor material 104 is formed. Optionally, a barrier material 106, as illustrated in FIG. 1 with dashed lines, may be disposed between the insulator material 102 and the semiconductor material 104. The insulator material 102 may include a conventional glass or insulative material, such as silicon dioxide ($SiO_2$), silicon nitride ($Si_3N_4$), silicon oxynitride (SiON), or aluminum oxide ($Al_2O_3$) (which may also be referred to as "sapphire"). Additional examples of the insulator material 102 include quartz, fused silica, diamond, ruby, yttria alumina garnet, yttria stabilized zirconium, magnesium fluoride, and magnesium oxide. The insulator material 102 is doped with at least one of a transition metal, a lanthanide, and an actinide. In some embodiments, the at least one of a transition metal, a lanthanide and an actinide may comprise a high atomic number dopant. As used herein, the phrase "high atomic number dopant" includes atomic elements having an atomic number greater than 57. Examples of the at least one of a transition metal, a lanthanide, and an actinide include, but are not limited to, cerium (Ce), neodymium (Nd), and praseodymium (Pr). The at least one of a transition metal, a lanthanide, and an actinide may also include a mixture of one or more transition metals, actinides and lanthanides. For example, the at least one of a transition metal, a lanthanide, and an actinide may include at least one transition metal, at least one lanthanide, and at least one actinide. In additional embodiments, the at least one of a transition metal, a lanthanide, and an actinide may comprise didymium, which includes a mixture of Pr and Nd. In additional embodiments, the insulator material 102 may include one or more portions, wherein each portion of the insulator material 102 comprises a different dopant of at least one of a transition metal, a lanthanide, and an actinide. Conversely, in some embodiments, the at least one of a transition metal, a lanthanide, and an actinide may be substantially homogeneously distributed insulator material 102. The amount of the at least one of a transition metal, a lanthanide, and an actinide in the insulator material 102 may be at least about 0.5% by weight. In some embodiments, the at least one of a transition metal, a lanthanide, and an actinide in the insulator material 102 may be between about 0.5% and about 5% by weight. In additional embodiments, the at least one of a transition metal, a lanthanide, and an actinide may have a differing concentration throughout a thickness of the insulator material 102. For example, a concentration of the at least one of a transition metal, a lanthanide, and an actinide may decrease throughout a thickness of the insulator material 102 as the insulator material 102 approaches the semiconductor material 104. The concentration may decrease linearly, or otherwise. The insulator material 102 may have a thickness of about 0.01 micron to about 10 microns.

The semiconductor material 104 may be formed over the insulator material 102, as is conventional. The semiconductor material 104 may comprise, for example, a silicon film. The semiconductor material 104 may have a minimal thickness, as the smaller the thickness of the semiconductor material 104, the lower the chance of radiation energy depositing within the semiconductor material 104. For example, the semiconductor material 104 may have a thickness of about 0.01 micron to about 10 microns. In some embodiments, the optional barrier material 106 may be formed between the insulator material 102 and the semiconductor material 104. The barrier material 106 may comprise, by way of non-limiting example, a thin film of silica, also known as silicon dioxide ($SiO_2$), deposited by conventional methods. Such methods include, by way of non-limiting example, low temperature oxidation of silane gas, decomposition of tetraethyl orthosilicate (TEOS), plasma-enhanced chemical vapor deposition of TEOS, and polymerization of TEOS using amino acid as a catalyst. The barrier material 106 may act to prevent diffusion of the dopant comprising at least one of a transition metal, a lanthanide, and an actinide from the insulator material 102 into the semiconductor material 104. The thickness of the barrier material 106 may be minimized so that the barrier material 106 acts as an effective barrier to diffusion of the at least one of a transition metal, a lanthanide and an actinide while also limiting the thickness of the barrier material 106 available for absorption of radiation energy. The barrier material 106 may have a thickness of about 0.01 micron to about 10 microns.

Because the insulator material 102 is doped with at least one of a transition metal, a lanthanide, and an actinide, the radiation-hardened semiconductor structure 100 exhibits improved radiation resistance in comparison to that of a conventional SOI substrate, and in comparison to that of a monolithic silicon substrate. The at least one of a transition metal, a lanthanide, and an actinide may have a large number of available electronic states. Because of the large number of available electronic states, the at least one of a transition metal, a lanthanide, and an actinide is capable of accepting and diffusing free electrons and protons, to reduce or even eliminate any radiation damage to the radiation-hardened semiconductor structure 100. In other words, the large number of electronic states in the at least one of a transition metal, a lanthanide, and an actinide may allow re-radiation of any absorbed radiation resulting in the relaxation of the absorbed radiation, effectively healing the radiation damage. Furthermore, using a mixture of one or more transition metals, lanthanides, and actinides may increase the potential electron interaction between the atoms of the one or more transition metals, lanthanides, and actinides, which may result in a faster decay rate of any absorbed radiation. The radiation-hardened semiconductor structure 100 may exhibit a radiation resistance of at least about 1.0 MeV electrons at a fluence of $5.7 \times 10^{15}/cm^2$, at least about 0.56 MeV of low energy protons at a fluence of $1 \times 10^{14}/cm^2$, and at least about 2.5 MeV of high-energy protons at a fluence of $1 \times 10^{14}/cm^2$.

Figure 2:
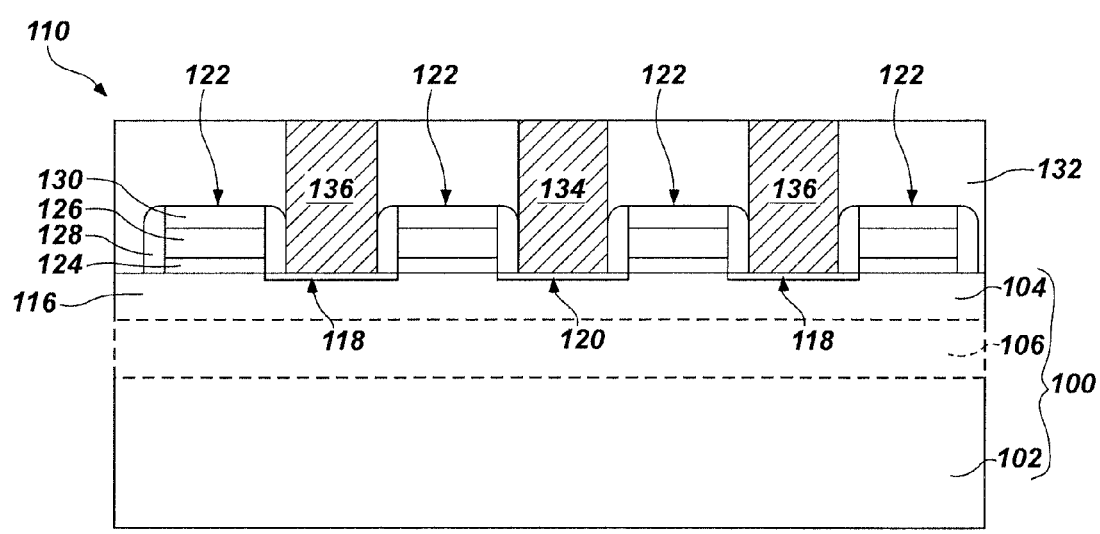
FIG. 2 is a cross-sectional view of a portion of a CMOS device formed in accordance with an embodiment of the invention including an insulator material doped with at least one of a transition metal, a lanthanide, and an actinide.

The radiation-hardened semiconductor structure 100 may be used in a semiconductor device, such as in semiconductor memory, logic and processors. For example, a complementary metal oxide semiconductor (CMOS) device 110 including the radiation-hardened semiconductor structure 100 is shown in FIG. 2. While the radiation-hardened semiconductor structure 100 may be used in a CMOS device 110, which may comprise logic, a microprocessor or a static random access memory (SRAM), the radiation-hardened semiconductor structure 100 may also be used in other devices, such as a dynamic random access memory (DRAM) device. Furthermore, while the radiation-hardened semiconductor structure 100 is described herein as part of CMOS device 110, it is understood that the semiconductor structure 100 may be used for portions of other semiconductor devices as well, including without limitation, logic devices and processor devices.

As shown in FIG. 2, the CMOS device 110 includes a plurality of memory cells formed on insulator material 102 doped with at least one of a transition metal, a lanthanide, and an actinide. The memory cells include a well 116, drain regions 118, source regions 120, and word lines or gate stacks 122 formed on the insulator material 102, according to conventional semiconductor processing techniques, which are not described in detail herein. Optionally, the barrier layer 106 may be formed between the insulator material 102 and the drain regions 118 and source regions 120. The well 116, drain regions 118 and source regions 120 may be formed by doping and patterning the semiconductor material 102. The gate stacks 122 may include a gate oxide region 124, a conductive gate region 126, spacers 128, and a cap 130. A dielectric material 132 may be formed over the gate stacks 122 having bit contact 134 and capacitor contacts 136 formed therein. The bit contacts 134 may be in electrical communication with the source regions 120 and the capacitor contacts 136 may be in electrical communication with the drain regions 118. In some embodiments, capacitors (not shown) may be formed in electrical communication with the capacitor contacts 136 to form a DRAM device, as is known in the art. The CMOS device 110 may be formed by conventional techniques and materials, which are not described in detail herein. Because, the insulator material 102 is doped with at least one of a transition metal, a lanthanide, and an actinide, the CMOS device 110 may be resistant to radiation damage and failure caused by radiation damage.

Semiconductor devices, such as the CMOS device 110 may be formed on the insulator material 102 doped with the at least one of a transition metal, a lanthanide, and an actinide using conventional techniques. Accordingly, forming semiconductor devices on the insulator material 102 doped with the at least one of a transition metal, a lanthanide, and an actinide does not significantly increase the cost or complexity of forming a radiation-hardened semiconductor device.

Examples of processes that may be used to form the radiation-hardened semiconductor structure 100 (FIG. 1) are described briefly below.

Wafers of insulator material or wafers of semiconductor material on insulator material (SOI) are commercially available. If the wafer of insulator material or SOI wafer is preformed, the wafer of insulator material or SOI wafer may be doped with the at least one of a transition metal, a lanthanide, and an actinide. For example, such a high atomic number dopant may be implanted or diffused into the wafer of insulator material as known in the art. In some embodiments, the wafer of insulator material may be doped with at least one of a transition metal, a lanthanide, and an actinide, and then the semiconductor material may be formed on the doped insulator material. By doping the insulator material before forming the semiconductor material, the semiconductor material may be protected from exposure to the dopant.

Figure 3:
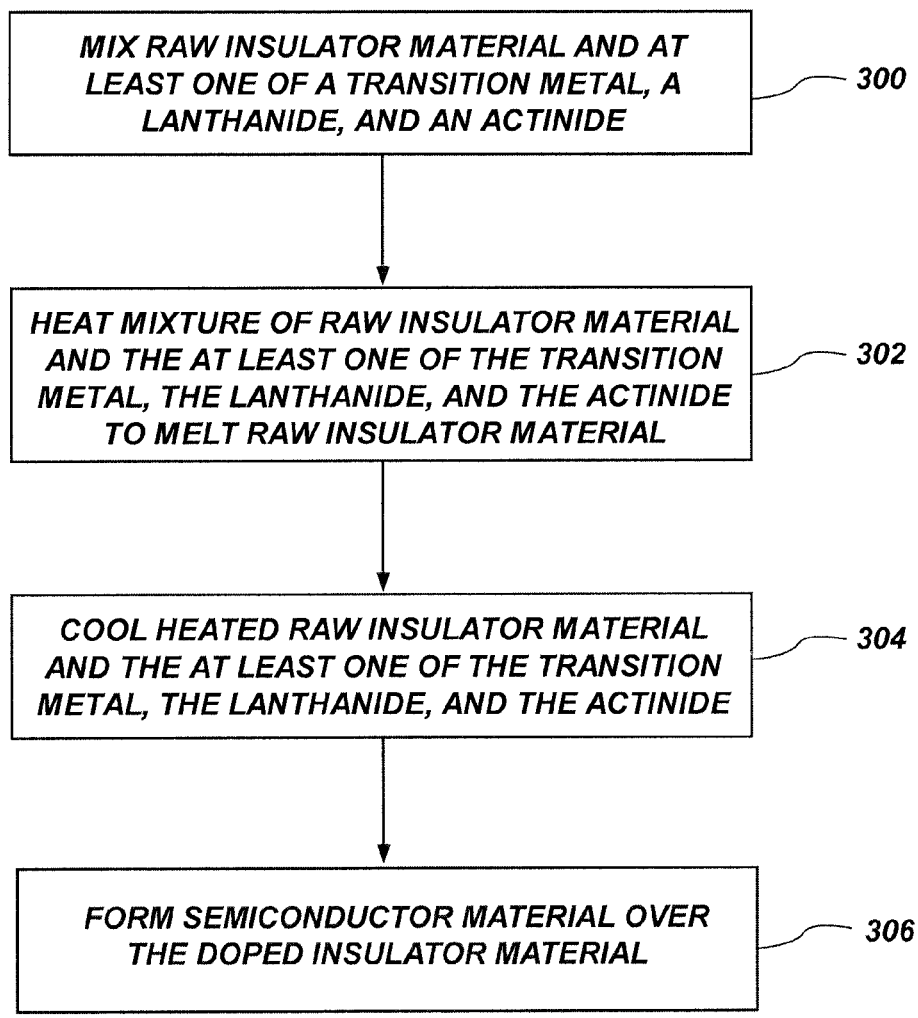
FIG. 3 is a flowchart of an embodiment of a method of forming the radiation-hardened semiconductor structure including the insulator doped with at least one of a transition metal, a lanthanide, and an actinide according to the present invention.

In other embodiments, the insulator material may be formed with the at least one of a transition metal, a lanthanide, and an actinide therein. Process flow of an embodiment of such a method of forming the insulator material having the at least one of a transition metal, a lanthanide, and an actinide therein is illustrated in FIG. 3. In act 300, raw materials of the insulator material and the high atomic number dopant or dopants are mixed together. For example, in one embodiment, a mixture of $SiO_2$ and cerium (III) silicate may be mixed together. The mixture of the raw materials of insulator material and the high atomic number dopant or dopants are then heated above the melting temperature of the raw insulator material to melt the raw insulator material in act 302. Alternatively, in additional embodiments, the raw materials of the insulator material may be melted and then the high atomic number dopant or dopants may be added to the melted raw materials of insulator material. In act 302, the molten mixture may, optionally, be further mixed to enhanced homogeneity of dopant distribution. In act 304, the heated mixture of the raw materials of the insulator material and the high atomic number dopant is cooled forming the insulator material having the high atomic number dopant dispersed throughout. The semiconductor material is then formed over the doped insulator material in act 306 to form the radiation-hardened semiconductor structure 100 (FIG. 1).

The invention has been described herein in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a radiation-hardened semiconductor structure, comprising:
   mixing a raw insulator material and the at least one transition metal, lanthanide, and actinide;
   heating the mixed raw insulator material and the at least one of a transition metal, a lanthanide, and an actinide above the melting temperature of the raw insulator material;
   cooling and solidifying the heated raw insulator material and the at least one of a transition metal, a lanthanide, and an actinide to form a doped insulator material; and
   forming a semiconductor material over the doped insulator material.

2. The method of claim 1, further comprising disposing a barrier material between the doped insulator material and the semiconductor material.

3. A method of forming a semiconductor device, comprising:
   mixing a raw insulator material with at least one of a transition metal, a lanthanide, and an actinide;
   heating the mixture of a raw insulator material and the at least one of a transition metal, a lanthanide, and an actinide above the melting temperature of the raw insulator material;
   solidifying the heated raw insulator material and the at least one of a transition metal, a lanthanide, and an actinide to form a doped insulator material;
   forming a semiconductor material over the doped insulator material; and
   forming a memory cell over the semiconductor material.

4. The method of claim 3, wherein mixing a raw insulator material with at least one of a transition metal, a lanthanide, and an actinide comprises mixing the raw insulator material with at least one of cerium, neodymium, and praseodymium.

5. The method of claim 3, wherein mixing a raw insulator material with at least one of a transition metal, a lanthanide, and an actinide comprises mixing the raw insulator material with at least one transition metal, at least one lanthanide, and at least one actinide.

* * * * *

UNITED STATES PATENT AND TRADEMARK OFFICE
CERTIFICATE OF CORRECTION

| | | |
|---|---|---|
| PATENT NO. | : 8,399,312 B2 | Page 1 of 1 |
| APPLICATION NO. | : 12/844684 | |
| DATED | : March 19, 2013 | |
| INVENTOR(S) | : John S. Canham | |

It is certified that error appears in the above-identified patent and that said Letters Patent is hereby corrected as shown below:

In the claims:

| | | | |
|---|---|---|---|
| CLAIM 1, | COLUMN 7, | LINE 17, | change "one" to --one of a-- |
| CLAIM 1, | COLUMN 7, | LINE 18, | change "lanthanide, and actinide;" to --a lanthanide, and an actinide;-- |
| CLAIM 1, | COLUMN 7, | LINE 19, | change "mixed" to --mixture of the-- |

Signed and Sealed this
Fourteenth Day of July, 2015

Michelle K. Lee
*Director of the United States Patent and Trademark Office*